United States Patent [19]
Draxelmayr

[11] Patent Number: 5,467,089
[45] Date of Patent: Nov. 14, 1995

[54] CAPACITOR ARRAY DIGITAL/ANALOG CONVERTER WITH COMPENSATION ARRAY FOR STRAY CAPACITANCE

[75] Inventor: Dieter Draxelmayr, Villach, Austria

[73] Assignee: Siemens Aktiengesellschaft, Munich

[21] Appl. No.: 91,172

[22] Filed: Jul. 13, 1993

[30] Foreign Application Priority Data

Jul. 13, 1992 [DE] Germany .................. 42 23 000.4

[51] Int. Cl.[6] .................................. H03M 1/78
[52] U.S. Cl. .................... 341/150; 341/118; 341/153
[58] Field of Search ..................... 341/118, 119, 341/120, 121, 150, 153, 172

[56] References Cited

U.S. PATENT DOCUMENTS

| | | | |
|---|---|---|---|
| 4,568,917 | 2/1986 | McKenzie et al. | 341/150 |
| 4,661,802 | 4/1987 | Yukawa | 341/150 |
| 4,760,376 | 7/1988 | Kobayashi et al. | 341/172 |
| 4,988,900 | 1/1991 | Fensch | 341/150 |
| 5,208,597 | 5/1993 | Early et al. | 341/172 |
| 5,235,335 | 8/1993 | Hester et al. | 341/150 |
| 5,276,446 | 1/1994 | Sellars | 341/118 |

FOREIGN PATENT DOCUMENTS

0170224B1  4/1991  European Pat. Off. ..

OTHER PUBLICATIONS

*Halbleiter–Schaltungstechnik*, Tietze et al., Springer–Verlag 1985, pp. 738–757.
Seitzer, *Elektronische Analog–Digital–Umsetzer*, Springer–Verlag 1977, pp. 82–83.
Nicollini et al., *A Fully Differential Sample and Hold Circuit for High Speed Applications*, IEEE Journal of Solid State Circuits, vol. 24 No. 5, Oct. 1989, pp. 1461–1464.

*Primary Examiner*—Howard L. Williams
*Attorney, Agent, or Firm*—Herbert L. Lerner; Laurence A. Greenberg

[57] ABSTRACT

A digital/analog converter with a weighted capacitive converter network is provided with weighted stray capacitors for reducing non-linearities in switching. Additional stray capacitors are connected in parallel to the otherwise present stray capacitors for that purpose. In the higher-value network capacitances, the additional stray capacitors are positive, in the lower-value network capacitances, the stray capacitors are effective, i.e. their effect is negative. The converter is constructed differentially in its entirety. The combination allows the optimization with regard to the chip surface.

1 Claim, 3 Drawing Sheets

CAPACITOR ARRAY DIGITAL/ANALOG CONVERTER WITH COMPENSATION ARRAY FOR STRAY CAPACITANCE

BACKGROUND OF THE INVENTION

Field of the Invention

The invention relates to a digital/analog converter with a weighted capacitive converter network.

Capacitive digital/analog converters have long been known, for instance from the book by D. Seitzer, entitled "Elektronische Analog-Digital-Umsetzer" [Electronic Analog/Digital Converters], Springer-Verlag, Berlin, 1977, pp. 82 ff. A switch controlled by digital information charges a capacitor in a first clock period. During a second clock period, the switch is opened and through a further switch a further capacitor is connected is parallel, so that the charge stored in the first clock period is distributed to the two capacitors. A switch network and a weighted capacitive network can substitute for the switch and the capacitor. The basic principles of weighted networks for D/A converters are known, for instance from the book by U. Tietze and Ch. Schenk, entitled "Halbleiter-Schaltungstechnik" [Semiconductor Circuitry], Springer-Verlag, Berlin, 7th Edition, 1985, pp. 739 ff.

A D/A converter according to the principle of charge redistribution with a weighted capacitive network is followed, in certain applications, by a time-continuous interpolation filter, in other words a low-pass filter. Due to the time-continuous filter, the output voltage of the digital/analog converter becomes time-continuous, or in other words is weighted at all times. Therefore, the transient response of the converter has a considerable influence on the attainable converter outcome. The goal in principle, in the conversion of one and the same digital code, is to obtain, at the output of the time-continuous filter, an analog value that is precisely equivalent to the digital code.

In practice, however, the output voltage associated with a digital code may be adulterated by switching peaks of the converter switch, as will be explained below in conjunction with the drawings. In such a converter, that phenomenon of switching peaks is especially disturbing at transitions from one code to the next, whenever several or many elements of the code change.

Although it is difficult in principle to avoid non-linearities entirely, a characteristic curve with a form that enables good linearity is desirable.

The use of an unsplit capacitive network requires larger capacitors to be used, which in turn results in a dramatic increase in the chip area required.

Shortening the transient response time causes the time in which a disturbed signal is present to be minimized, although that requires substantially more capacity than the corresponding original conversion system. That route is in fact not achievable especially in high-speed converters.

Although it is also possible for the D/A converter and the following filter to be followed by a sample and hold element, which samples the command value of the converter and keeps it constant during the time when switching peaks can occur, in order to improve the linearity performance, that option entails considerable expenditure for circuitry because the sample and hold element must be integrated with the rest.

SUMMARY OF THE INVENTION

It is accordingly an object of the invention to provide a digital/analog converter with a weighted capacitive converter network, which overcomes the hereinafore-mentioned disadvantages of the heretofore-known devices of this general type and which has low power consumption and a good linearity curve while only requiring little chip area.

With the foregoing and other objects in view there is provided, in accordance with the invention, a digital/analog converter, comprising a weighted capacitive converter network having weighted stray capacitors.

In accordance with another feature of the invention, there are provided additional stray capacitors connected parallel to the weighted stray capacitors, forming total weighted stray capacitances.

In accordance with a further feature of the invention, there are provided additional stray capacitors for higher-value capacitors of the converter network.

In accordance with an added feature of the invention, there are provided stray capacitors with an effectively negative capacitance being connected parallel to the weighted stray capacitors of the converter network.

In accordance with an additional feature of the invention, the negative capacitors are formed by stray capacitors having opposite-phase triggering.

In accordance with yet another feature of the invention, the stray capacitors include a combination of stray capacitors with positively and negatively acting capacitors.

In accordance with yet a further feature of the invention, the converter network is a split converter network.

In accordance with yet an added feature of the invention, the additional stray capacitors are formed with the same materials and with the same topologies as the weighted stray capacitors.

In accordance with yet an additional feature of the invention, the weighted converter network and the weighted stray capacitors are binary-weighted.

With the objects of the invention in view, there is also provided a digital/analog converter having a weighted capacitive network, comprising a differential operational amplifier having first and second inputs and first and second outputs; first and second weighted capacitive networks; a first capacitor connected between the first input and the first output, a second capacitor connected between the second input and the second output; third and fourth capacitors; means for connecting the first and second weighted capacitive networks and the third and fourth capacitors symmetrically to a ground potential during a first clock period; means for connecting the first input through the first weighted capacitive network to the first output, and for connecting the second input through the second weighted capacitive network to the second output, symmetrically during a second clock period; and means for connecting the first input through the third capacitor to the second output, and for connecting the second input through the fourth capacitor to the first output, symmetrically during the second clock period.

Other features which are considered as characteristic for the invention are set forth in the appended claims.

Although the invention is illustrated and described herein as embodied in a digital/analog converter with a weighted capacitive converter network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advan-

DESCRIPTION OF THE PREFERRED EMBODIMENTS

Figure 1:
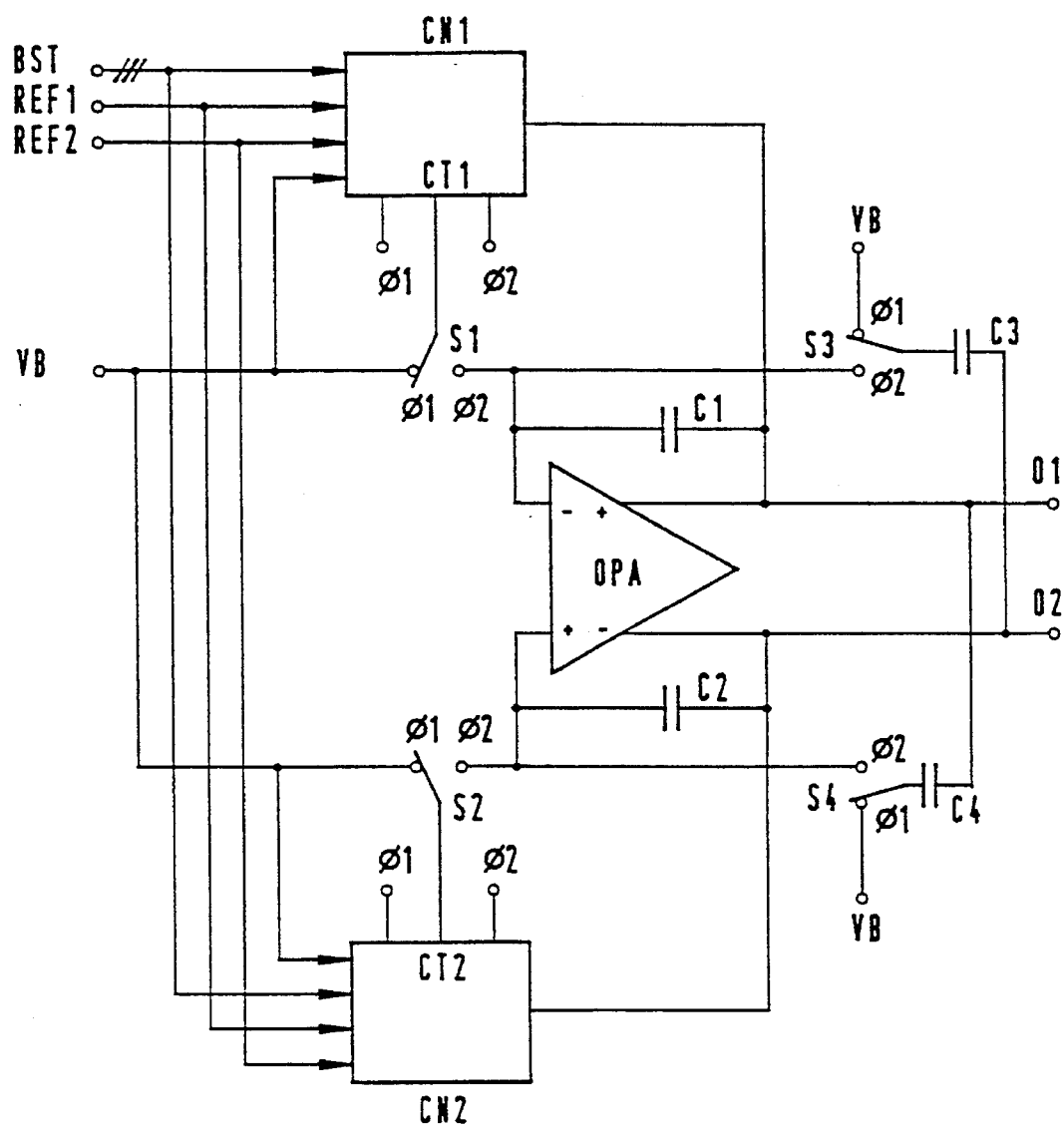
FIG. 1 is a schematic and block circuit diagram of a digital/analog converter.

Referring now to the figures of the drawing in detail and first, particularly, to FIG. 1 thereof, there is seen a block circuit diagram showing a digital/analog converter according to the invention. The converter construction is fully differential. This means that the wiring of an operational amplifier OPA is symmetrical with respect to inverting–and non-inverting +terminals thereof. The operational amplifier is connected to four capacitors C1–C4 and two capacitive converter networks CN1 and CN2. The capacitors C1 and C3 are identical to one another, and the capacitors C2 and C4 are identical to one another. The configuration operates with a two-phase clock period $\phi 1$ and $\phi 2$, which is generated by a non-illustrated clock generator. Input variables for the capacitor networks are reference potentials REF1 and REF2, a ground potential VB and a control bus BST, which includes the digital information to be converted. The capacitor networks and switches S1–S4 are controlled by the clock periods $\phi 1$ and $\phi 2$.

The wiring for the inverting input–and the non-inverting output +of the operational amplifier OPA provides for the capacitor C1 being connected between these two terminals. The inverting input is also connected at the clock period $\phi 2$ to a node point CT1 of the capacitor network CN1 through the switch S1 and to one terminal of the capacitor C3 through the switch S3. Another terminal of the capacitor C3 is connected to an inverting output 02 of the operational amplifier. The switches S1 and S3 are connected to the ground potential VB at the clock period $\phi 1$, so that the capacitor C3 and the node point CT1 of the capacitor network CN1 are connected to the ground potential. The non-inverting output +of the operational amplifier OPA is connected to an output 01 and to one terminal of the capacitor network CN1. The non-inverting input +and the inverting output–of the operational amplifier OPA of FIG. 1 are wired in corresponding fashion.

During the clock period $\phi 1$, the capacitor networks CN1 and CN2 are charged to the reference potentials REF1, REF2 and the ground potential VB in accordance with the digital code applied. These reference potentials may, for instance, be the positive and negative input reference voltage, if the potential VB is ground potential. At the same time, with the clock period $\phi 1$, the outputs 01 and 02 of the operational amplifier keep the same values as in the preceding clock period. The capacitors C3 and C4 are therefore charged to the output potentials of the outputs 01 and 02.

During the clock period $\phi 2$, one terminal of each of the capacitors C4 and C3 is applied to the respective non-inverting and inverting inputs of the operational amplifier through the respective switches S4 and S3. As a consequence of this feedback, it follows that the charges at the capacitors C3 and C4 compensate for the charges at the capacitors C1 and C2, respectively. At the same time, a new charge redistribution takes place between the capacitors C1 and C3, on one hand, and C2 and C4 on the other hand, when the capacitor networks CN1 and CN2 are connected to the feedback path through the switches S1 and S2. The charges stored on the capacitor networks CN1 and CN2 are therefore not redistributed, so that the outputs or output terminals 01 and 02 assume the analog voltage value that corresponds to the last digital input signal for the capacitor networks during the clock period $\phi 1$. It should be added that the capacitor networks can be selected to be very low in capacity, because they are limited only by the accuracy of the compensation between the capacitors C1 and C3, on one hand, and the capacitors C2 and C4, on the other hand.

Figure 2:
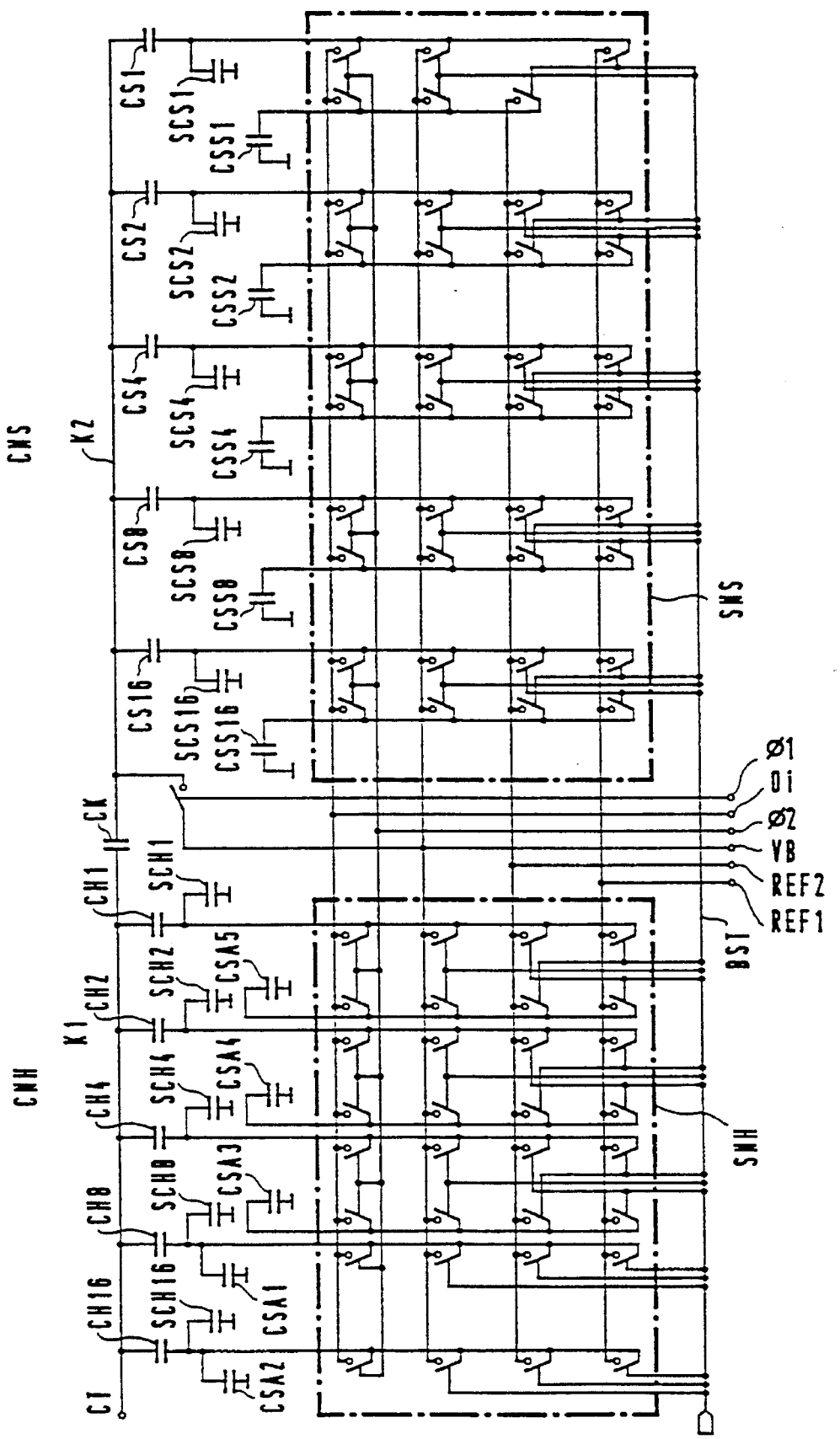
FIG. 2 is a more-detailed schematic circuit diagram of a converter network according to the invention.

FIG. 2 shows one of the two capacitor networks in detail. Each capacitor network includes a main network CNH and a subnetwork or split network CNS. The two network parts are connected to one another through a coupling capacitor CK. The network parts CNH and CNS respectively include weighted capacitors CH1–CH16 and CS1–CS16. This network configuration is merely one example of the invention. It is understood that the capacitors may also be distributed differently among the split networks, or a single unsplit network may be provided without any subnetwork. The capacitors of the main network CNH, which may be referred to as a whole as CHi, each have one terminal connected to a first common node point K1 and to a terminal CT. Each of the weighted capacitors of the main network have another terminal connected to a switch network SNH.

The weighted capacitors of the split network CNS, which may be referred to as a whole as CSi, each have one terminal connected to a second common node point K2, which can be connected to the ground potential VB through a switch which is clocked by the clock period $\phi 1$. This switch may also be omitted. The coupling capacitor CK is located between the two node points K1 and K2. Each of the weighted capacitors of the split network have other terminals which are connected to an associated switch network SNS.

In the exemplary embodiment of FIG. 2, each switch network has four switch levels. The switches of three switch levels are controlled through the control bus BST, so that as a function of the digital code being applied, one of the potentials REF1, REF2 or VB at a time can be connected to the associated terminal of one of the weighted capacitors of the main network or of the split network. The fourth switch level is controlled by the clock period $\phi 2$ and may connect the associated output 01 or 02 of the operational amplifier OPA to the applicable terminal of the weighted capacitors. The node points K1 and K2 can be connected through the terminal CT to one of the input terminals of the operational amplifier or to the ground potential VB, as described for FIG. 1.

In FIG. 2, in addition to the weighted useful capacitors CH1–CH16 and CS1–CS16, stray capacitors SCH1–SCH16 for the main network CNH and the stray capacitors SCS1–SCS16 for the split network CNS are shown. These stray capacitors result, for instance, from the wiring or from the technological construction of the useful capacitors. During the precharging phase of clock period $\phi 1$, the stray capacitors of the capacitor networks are charged either to a reference potential or to the ground potential VB. During the transition from the clock period $\phi 1$ to the clock period $\phi 2$, the stray capacitors must be recharged to the analog final output voltages of the operational amplifier. The capacity required for this must be brought to bear essentially by the operational amplifier OPA.

The invention begins with the recognition that non-linearities described above and below in conjunction with FIG. 3 can be ascribed to a great extent to the stray capacitors. The invention therefore provides for a disposition of additional stray capacitors, parallel to the existing stray capacitors, in such a way that all of the stray capacitors are weighted. With such stray capacitors which are weighted as compared with the useful capacitors, the effective charge of all of the parasitic stray capacitors is then proportional to the output voltage at the output terminals of the operational amplifier. Optimal adaptation of the time constants is also possible on the basis of the particular switch resistance and the associated stray capacitance. Since the effective charge of all of the stray capacitors is proportional to the output voltage, only an amplification error can occur, because the transient response is adapted to the particular digital code.

In a converter with binary-weighted useful capacitors, the teaching of the invention means that the parasitic capacitors must likewise be binary-weighted. In fact, this is typically not the case. This mismatch generally has especially severe effects between the main network and the split network.

According to a feature of the teaching of the invention, it is provided that the correct weighting of the parasitic stray capacitors be attained by connecting additional parasitic capacitors parallel to the already existing stray capacitors until a suitable, for instance binary, weighting is achieved. FIG. 2 shows such additional stray capacitors CSA1 and CSA2 of the network SNH. Typically, one begins with the stray capacitance of the least significant bit LSB. Next, the parasitic capacitances of the more-significant bits are each doubled from one stage to the next. However, since the stray capacitance of the least significant bit LSB is usually relatively high, proceeding in this way, because of the step by step doubling of the stray capacitances, even with the low capacitances provided in the configuration of FIG. 1, requires overall comparatively high capacitances and therefore a large chip area.

According to another feature of the invention, the beginning is made at the stray capacitance of a more-significant bit, and the stray capacitances of the lower-weighted bits are reduced in accordance with the necessary weighting. This becomes possible since a stray capacitor with an effectively negative capacitance, that is one that is negative in its effect, is connected parallel to the stray capacitors of the less-significant bits during the second clock period. In a configuration according to FIG. 1, with a fully differential structure, so that each signal is also present in inverted form, a parallel circuit of a negative effective capacitor is achieved by the parallel connection of a capacitor with opposite-phase triggering. Due to the opposite-phase triggering of the two capacitors, it is possible to compensate for the desired portion of the wrong charge, the overall outward effect of which is a reduction in capacitance. FIG. 2 shows compensation stray capacitors CSS1–CSS16 of the split network SNS, which act as negative capacitors. In developing the weighted parasitic capacitors, it is therefore possible to begin at the most-significant bit MSB and to compensate for all of the less-significant bits accordingly, until a certain weighting, for instance a binary weighting, is created. Under some circumstances, some high capacitances should be compensated for relatively greatly, but overall this procedure consumes less chip area than the procedure described above that begins with the LSB.

It is especially advantageous to achieve the weighted stray capacitors by a combination of these two procedures, namely the parallel connection of positively and negatively acting capacitors. The requisite chip area can be minimized with such a combination. It is therefore advantageous, with the less-significant capacitors, for example of the split capacitor network, to employ the compensation procedure with negative effective capacitors, in order to lessen their wrong charge. Conversely, further stray capacitors are additively connected parallel to the most-significant bits of the main capacitor network, in order to increase the total stray capacitance along the lines of the weighting. This is shown by the split network SNH having stray capacitors CSA1–CSA5.

In this way, an effective weighting of all of the stray capacitors of the entire capacitor network, in other words the two capacitor networks CN1 and CN2, can be achieved. If when the capacitors to be additionally provided are constructed, materials and topologies that also make up the naturally existing stray capacitors are chosen, then weighting of the total stray capacitors that is independent of technology can be achieved. This has the advantage of causing the entire parasitic network to behave identically overall in the event of parameter fluctuations.

Figure 3:
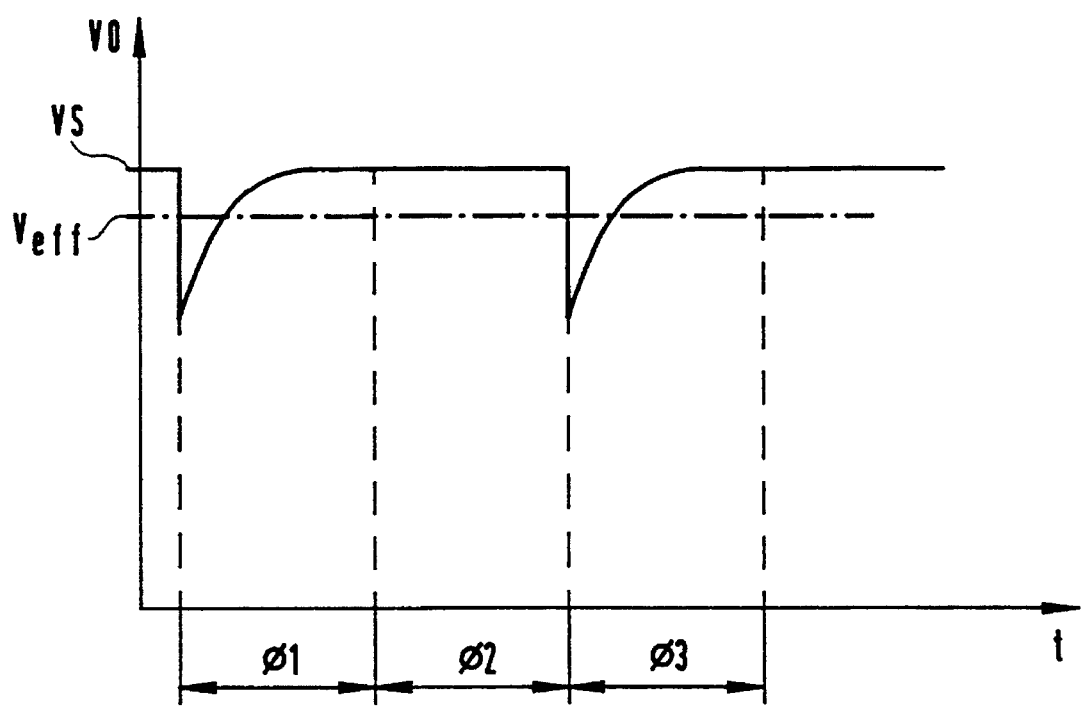
FIG. 3 is a diagram used to explain the problem that the invention seeks to solve.

FIG. 3 diagrammatically illustrates that the output voltage associated with a digital code may be adulterated by switching peaks of the converter switch. A command value of an output voltage VS briefly collapses at the beginning of each first clock period $\phi 1$, which controls the weighted network, and then reaches the command value. From the signal course, an effective output voltage $V_{eff}$ is reduced as compared with the command output voltage VS.

In a converter of the type described, such a phenomenon of switching peaks is especially disturbing at transitions from one code to the next, whenever several or many elements of the code change. That is the case, for instance, at the transition from a code 01111 to a code 10000. The reason therefor is that the aforementioned switching peaks are highly correlated with the individual bits. If many bits change, then the switching peak also changes greatly. The overall result is that the parasitic effect causes pronounced non-linearity in the characteristic curve of the D/A converter.

It is difficult in principle to avoid non-linearities entirely. However, a characteristic curve with a form that enables good linearity is desirable. Other disruptions in characteristic curves, such as an amplification error, play a very minor role as compared with non-linearities, in both D/A converters and in most communications applications.

In integrated D/A converters, the converter network is often split into two capacitive subnetworks, which are joined through a coupling capacitor. A D/A converter with an unsplit capacitive network will typically have an improved linearity curve. However, the use of an unsplit capacitive network means that larger capacitors must be used, which in turn means a dramatic increase in the chip area required.

Another option for improving the linearity curve is to shorten the transient response time. Then the time in which a disturbed signal is present is minimized, as can be explained from FIG. 3. However, taking that route requires substantially more capacity than the corresponding original conversion system. Especially in high-speed converters, that route is in fact not achievable.

Finally, in order to improve the linearity performance, it is also possible for the D/A converter and the following filter to be followed by a sample and hold element, which samples the command value of the converter and keeps it constant during the time when switching peaks can occur. However, that option entails considerable expenditure for circuitry because the sample and hold element must be integrated in with the rest.

I claim:

1. A digital/analog converter having a weighted capacitive network, comprising:

a differential operational amplifier having first and second inputs and first and second outputs;

first and second weighted capacitive networks;

a first capacitor connected between the first input and the first output, a second capacitor connected between the second input and the second output;

third and fourth capacitors;

means for connecting said first and second weighted capacitive networks and said third and fourth capacitors symmetrically to a ground potential during a first clock period;

means for connecting the first input through said first weighted capacitive network to the first output, and for connecting the second input through said second weighted capacitive network to the second output, symmetrically during a second clock period; and means for connecting the first input through said third capacitor to the second output, and for connecting the second input through said fourth capacitor to the first output, symmetrically during the second clock period.

* * * * *